United States Patent
Tang et al.

(10) Patent No.: US 9,778,573 B2
(45) Date of Patent: Oct. 3, 2017

(54) OPTICAL ILLUMINATION SYSTEM

(71) Applicant: United States Government as Represented by The Department of Veterans Affairs, Washington, DC (US)

(72) Inventors: Cha-Min Tang, Wayne, PA (US); Valentina Emiliani, Paris (FR); Peter Pennefather, Toronto (CA)

(73) Assignee: THE UNITED STATES OF AMERICA AS REPRESENTED BY THE DEPARTMENT OF VETERANS AFFAIRS, Washington, DC (US)

( * ) Notice: Subject to any disclaimer, the term of this patent is extended or adjusted under 35 U.S.C. 154(b) by 204 days.

(21) Appl. No.: 14/776,686

(22) PCT Filed: Mar. 14, 2014

(86) PCT No.: PCT/US2014/028536
§ 371 (c)(1),
(2) Date: Sep. 14, 2015

(87) PCT Pub. No.: WO2014/152984
PCT Pub. Date: Sep. 25, 2014

(65) Prior Publication Data
US 2016/0033874 A1  Feb. 4, 2016

Related U.S. Application Data

(60) Provisional application No. 61/781,105, filed on Mar. 14, 2013.

(51) Int. Cl.
*G02B 26/00* (2006.01)
*G02B 21/06* (2006.01)
(Continued)

(52) U.S. Cl.
CPC ...... *G03F 7/70025* (2013.01); *B29C 67/0066* (2013.01); *G02B 13/0095* (2013.01);
(Continued)

(58) Field of Classification Search
CPC ............ B29C 67/0066; G02B 13/0095; G02B 21/0024; G02B 21/0076; G02B 21/06;
(Continued)

(56) References Cited

U.S. PATENT DOCUMENTS 5,024,508 A  6/1991 Horner
7,535,607 B2  5/2009 Schwerdtner et al.
(Continued)

FOREIGN PATENT DOCUMENTS

JP  4024017 B2  12/2007

OTHER PUBLICATIONS

International Search Report dated Jul. 11, 2014, issued for International Application No. PCT/US2014/028536.
(Continued)

*Primary Examiner* — Bumsuk Won
*Assistant Examiner* — Colin X Beatty
(74) *Attorney, Agent, or Firm* — Procopio Cory Hargreaves and Savitch LLP; Pattric J. Rawlins

(57) ABSTRACT

Systems and methods are provided that combine an amplitude modulation SLM with a phase modulating SLM in the same optical illumination system. The combination of the amplitude modulation SLM and the phase modulation SLM allows the optical illumination to compensate for the limitations of amplitude modulation SLM by using phase modulating SLM and conversely to compensate for the limitations of phase modulation SLM by using amplitude modulating SLM.

25 Claims, 4 Drawing Sheets

(51) Int. Cl.
  *G03F 7/20* (2006.01)
  *G03B 21/20* (2006.01)
  *G03B 21/00* (2006.01)
  *B29C 67/00* (2017.01)
  *G02B 13/00* (2006.01)
  *G02B 26/08* (2006.01)
  *H01S 3/00* (2006.01)
  *G02B 21/00* (2006.01)

(52) U.S. Cl.
  CPC ..... *G02B 21/0024* (2013.01); *G02B 21/0076* (2013.01); *G02B 21/06* (2013.01); *G02B 26/0833* (2013.01); *G03B 21/005* (2013.01); *G03B 21/2033* (2013.01); *G03F 7/70291* (2013.01); *G03F 7/70416* (2013.01); *H01S 3/0057* (2013.01); *H01S 3/0085* (2013.01)

(58) Field of Classification Search
  CPC .............. G02B 21/005; G02B 21/2033; G02B 26/0833; H01S 3/0057; H01S 3/0085
  USPC ...................................... 359/1–20, 237, 385
  See application file for complete search history.

(56) References Cited

U.S. PATENT DOCUMENTS

| 8,339,695 | B2 | 12/2012 | Haussler et al. |
| 2004/0089804 | A1* | 5/2004 | Dantus .................. H01J 49/164 250/288 |
| 2010/0027087 | A1 | 2/2010 | Lewin et al. |

OTHER PUBLICATIONS

Written Opinion of the International Searching Authority issued by United States Patent Office for International Application No. PCT/US2014/028536.

* cited by examiner

OPTICAL ILLUMINATION SYSTEM

BACKGROUND

Field of the Invention

The present disclosure generally relates to optical illumination systems are more specifically relates to the use of amplitude modulation spatial light modulators in combination with phase modulation spatial light modulators in an optical illumination system.

Related Art

One conventional means to create spatial light patterns is to modulate the amplitude of light as a function of position within a two dimensional plane. Examples of such conventional means include traditional film projection, liquid crystal display ("LCD") projectors, and digital micromirror device ("DMD") based projectors. DMD devices are reflective devices that can project very high intensities of light and can be very rapidly switched. A fundamental limitation of DMD devices is that they are extremely inefficient at utilizing the available light energy when only a small portion of the target area (e.g., a sample) needs to be illuminated. This is particularly problematic if small localized regions of the sample require very high light intensities, such as during photolysis of caged compound and stimulation for optogenetics. In addition, DMD devices embody a fundamentally two dimensional technology and cannot simultaneously control light in three dimensions.

An alternate conventional means to create spatial light patterns is to modulate the phase of the light. An example of this conventional means includes holography. Fundamental limitations of digital holographic systems include the production of zero and higher order diffraction patterns as well as ghost images that must be blocked. Typically, a static physical barrier is used to block the zero order diffraction pattern. Currently, there are no practical solutions to block the higher order diffraction patterns and ghost images and in many circumstances these extraneous patterns are unacceptable. In addition, most phase only spatial light modulators ("SLMs") are unable to rapidly switch between different patterns. Moreover, the diffraction efficiency and therefore the distribution of light in the field of view of the objective lens depend on the lateral position. In most applications for patterned illumination it is desirable to have a flat field in terms of intensity as a function of space.

Yet another alternate conventional means for creating spatial light patterns is to sequentially scan a series of points rapidly as is currently done with confocal laser scanning microscopy and two-photon microscopy. This means is problematic because the speed of scanning is insufficient and is further problematic due to limitations related to how much power any single spot on the sample can tolerate.

Therefore, what is needed are systems and methods that overcome these significant problems found in the conventional systems as described above.

SUMMARY

The present disclosure described systems and methods that overcome the limitations identified above by combining an amplitude modulation SLM with a phase modulating SLM in the same optical illumination system. The combination of the amplitude modulation SLM and the phase modulation SLM allows the optical illumination to compensate for the limitations of amplitude modulation SLM by using phase modulating SLM and conversely to compensate for the limitations of phase modulation SLM by using amplitude modulating SLM.

In one embodiment, an optical illumination system having an optical axis is provided where there optical illumination system includes an image plane that is perpendicular to the optical axis and an aperture plane that is perpendicular to the optical axis. The system also includes an amplitude modulating spatial light modulator positioned in a conjugate plane of the image plane and configured to direct an optical signal to the image plane. The system also includes a phase modulating spatial light modulator positioned in a conjugate plane of the aperture plane and configured to direct an optical signal to the amplitude modulating spatial light modulator. The system also includes a coherence light source optically coupled with the phase modulating spatial light modulator, wherein the coherence light source is configured to illuminate at least a portion of the image plane by directing an optical signal to the phase modulating spatial light modulator, which directs said optical signal to the amplitude modulating spatial light modulator, which directs said optical signal to the image plane.

Other features and advantages of the present invention will become more readily apparent to those of ordinary skill in the art after reviewing the following detailed description and accompanying drawings.

BRIEF DESCRIPTION OF THE DRAWINGS

The structure and operation of the present invention will be understood from a review of the following detailed description and the accompanying drawings in which like reference numerals refer to like parts and in which.

DETAILED DESCRIPTION

Figure 1A:
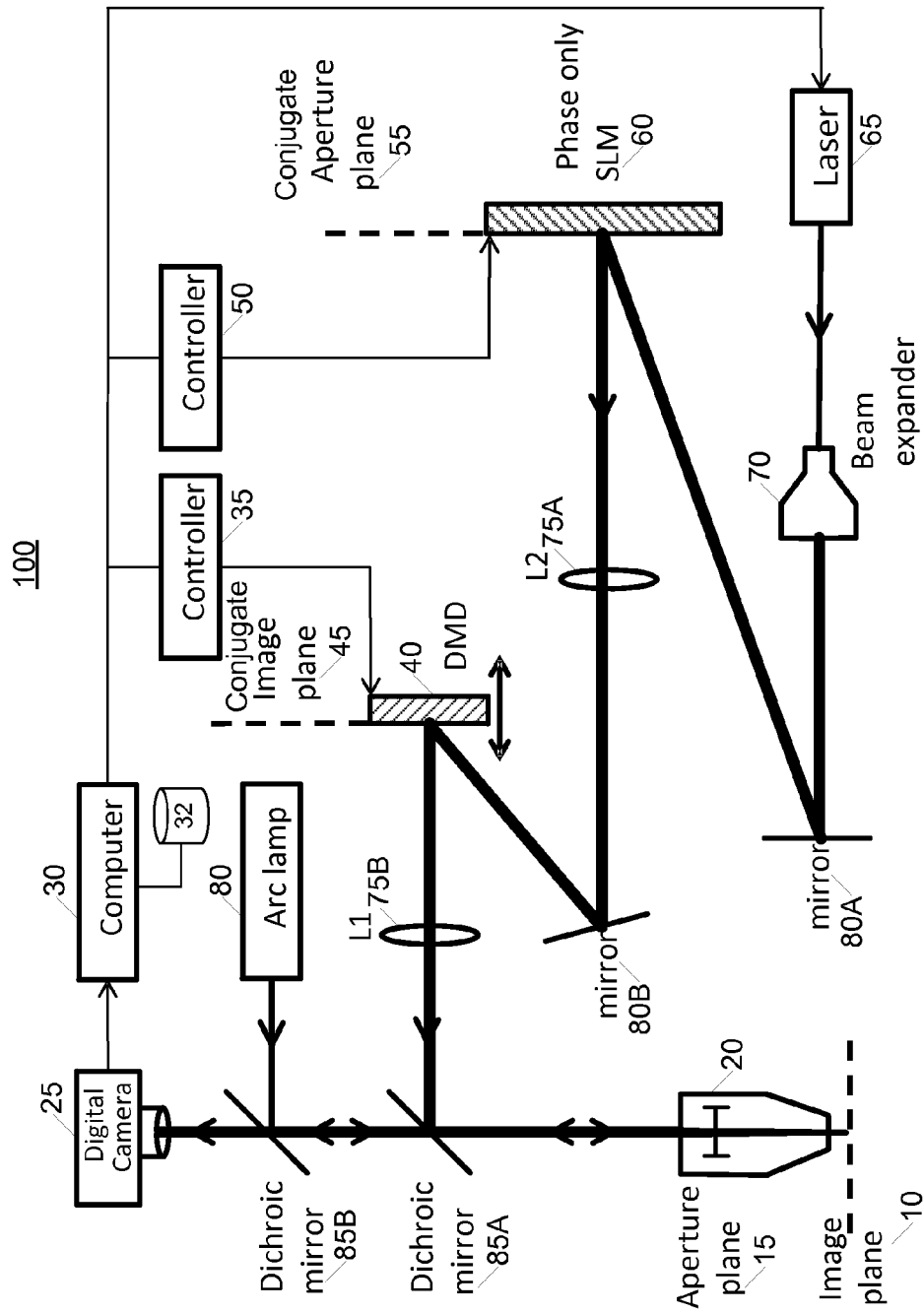
FIG. 1A illustrates an example optical illumination system according to an embodiment.

Certain embodiments disclosed herein provide an optical illumination system comprising a phase modulating spatial light modulator situated at a conjugate of the aperture plane and an amplitude modulating spatial light modulator situated downstream from the a phase modulating spatial light modulator at a conjugate of the image plane. However, one skilled in the art readily comprehends that the embodiments disclosed herein may be deployed in any type of optical illumination system, including but not limited to: microscopy, optogenetics, 3D printing, lithography and 3D displays, just to name a few.

After reading this description it will become apparent to one skilled in the art how to implement the invention in various alternative embodiments and alternative applications. However, although various embodiments of the present invention will be described herein, it is understood that these embodiments are presented by way of example only, and not limitation. As such, this detailed description of various alternative embodiments should not be construed to limit the scope or breadth of the present invention.

Certain applications of the optical illumination system include, but are not limited to, multi-site photostimulation, two-photon photostimulation, structured illumination for microscopy and light controlled 3D fabrication (3D printing), just to name a few.

Regarding multi-site photostimulation, in experimental biology one may need to simultaneously create highly focused complex light patterns to induce photolysis onto caged compounds and optogenetically engineered cells. The light patterns need to be free of unwanted diffraction patterns and be able to switch between different patterns rapidly. The presently described optical illumination system is ideal for this type of multi-site photostimulation application.

Regarding two-photon photostimulation, the presently described optical illumination system overcomes the limitations of conventional DMD systems for two-photon stimulation. The presently described optical illumination system is particularly useful for in vivo studies that require a high degree of light penetration into scattering tissue.

Regarding structured illumination for microscopy, the presently described optical illumination system provides a dynamic means to create complex illumination patterns with significantly improved and high light utilization efficiency. The illumination patterns created by the presently described optical illumination system advantageously are void of unwanted diffraction patterns.

Regarding light controlled 3D fabrication, two-photon polymerization using SLM controlled holography can be employed to produce microscale devices because of its flexibility in producing structures with a wide range of geometries. The presently described optical illumination system improves the performance of such a fabrication method by masking the unwanted diffraction pattern and by allowing the DMD to independently control of the light energy that can be delivered to specific locations. Advantageously, although the axial resolution might be limited in such an embodiment, this can be compensated for by moving the position of the DMD at critical locations. This fabrication method is particularly useful for initial substrates that may be in a fluid state and which are not highly scattering (e.g., clear plastics, tissue scaffolds and the like).

FIG. 1A illustrates an example optical illumination system 100 according to an embodiment. In the illustrated embodiment, the system 100 comprises an objective lens 20 having a field of view positioned over an image plane 10 that is perpendicular to the optical axis of the objective lens. The objective lens 20 comprises a back aperture on an aperture plane 15 that is also perpendicular to the optical axis of the objective lens. The optical illumination system 100 is configured for epi-illumination and may have a digital camera 25 positioned on the optical axis of the objective lens 20 via one or more mirrors such as dichroic mirrors 85A and 85B. The system 100 may also include an arc lamp 80 to facilitate epi-illumination. The digital camera 25 may be communicatively coupled (two way) with a computer 30 that has access to a non-transitory computer readable medium such as memory 32. Memory 32 is configured to store computer/processor/controller implementable instructions and executable modules as well as data and temporal spatial patterns that can be used by the computer 30 and/or the one or more controllers (35, 50) to configure the various elements of the optical illumination system 100 and facilitate operation of the optical illumination system 100.

Computer 30 is configured to send configuration and operation instructions to one or more controllers such as controllers 35 and 50. Controller 35 is configured to control the operation of amplitude modulating spatial light modulator 40 (illustrated in this embodiment as a digital micromirror device, DMD 40). Controller 50 is configured to control the operation of phase modulating spatial light modulator 60 (illustrated in this embodiment as a phase only spatial light modulator, SLM 60). Computer 30 is also configured to send configuration and operation instructions to one or more coherence light sources 65 (illustrated in this embodiment as laser 65). Such instructions to laser 65 can be sent directly or through a controller (not shown).

Advantageously, the SLM 60 is positioned in a conjugate plane 55 of the aperture plane 15. Similarly, the DMD 40 is positioned in a conjugate plane 45 of the image plane 10. In an alternative embodiment, the DMD 40 may be positioned adjacent to a conjugate plane 45 of the image plane 10 in order to protect the DMD 40 from being damaged by high intensity light signals.

The laser 65 is optically coupled with the SLM 60, e.g. via a beam expander 70 that expands the optical signal from the laser 65 to optimally fill the aperture of the SLM 60 with the optical signal. The laser 65 is configured to illuminate at least a portion of the image plane by directing an optical signal to the SLM 60, which in turn directs the optical signal to the DMD 40, which applies a desired mask pattern to the optical signal and then directs the patterned optical signal to the image plane via the objective lens 20. The laser 65 may be optically coupled with the SLM 60 via one or more lenses (not shown) or mirrors 80A. The SLM 60 may similarly be optically coupled with the DMD 40 via one or more lenses 75A or mirrors 80B. The DMD 40 may similarly be optically coupled with the objective lens 20 via one or more lenses 75B and one or more mirrors 85A.

Advantageously, in the illumination optical path, the SLM 60 is positioned upstream from the DMD 40 and situated in a conjugate aperture plane 55 position in the optical path that is conjugate to the aperture plane 15 of the microscope objective 20. Similarly, the DMD 40 is situated in a conjugate image plane 45 position in the optical path that is conjugate to the image plane 10 of the microscope objective 20. In an alternative embodiment, the DMD 40 is situated adjacent to a conjugate image plane 45 position in the optical path that is specifically not conjugate to the image plane 10 of the microscope objective 20. Such a position may advantageously protect the DMD 40 from high intensity light and/or mitigate photodamage to the micromirrors during two-photo applications.

In various embodiments, one or more of the lenses 75A and 75B are employed to project the pattern from the DMD 40 to fill the back aperture of the objective lens 20. In some embodiments, the angle of incidence for the SLM 60 is less than or equal to 10 degrees and the angle of incidence for the DMD 40 is substantially equal to 12 degrees.

Certain benefits of the presently descried optical illumination system include: (1) the SLM 60 can direct the light from the laser to the appropriate micromirrors on the DMD 40 to increase the efficiency of light utilization by the DMD

40; (2) the DMD 40 can impose a pattern on the optical signal to block unwanted light that is generated by the hologram from the SLM 60 (e.g., zero and higher order diffraction patterns as well as ghost patterns). The DMD 40 can also be used to rapidly switch between a number of different masking patterns, which allows for simple but very rapid illumination and/or mask patterns. Additionally, the DMD 40 can be used to control the light intensity at a particular location on the image plane independent of the holographic pattern.

Figure 1B:
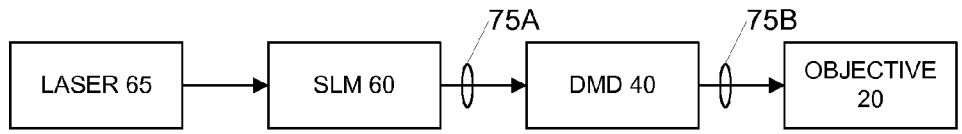
FIG. 1B is a simplified illustration of an optical path in the optical illumination system of FIG. 1A.

FIG. 1B is a simplified illustration of an optical path in the optical illumination system 100 of FIG. 1A. In the illustrated embodiment, the optical path comprises the laser 65 which originates an illumination optical signal. The laser 65 may be any of a variety of types of laser, including but not limited to, a continuous wave laser, a pulsed laser, or an amplified laser, just to name a few. The laser 65 directs the optical signal to the SLM 60 and the SLM 60 in turn directs the optical signal to the DMD 40 via one or more lenses 75A. The DMD 40 in turn directs the optical signal to the objective 20 via one or more lenses 75B.

Figure 1C:
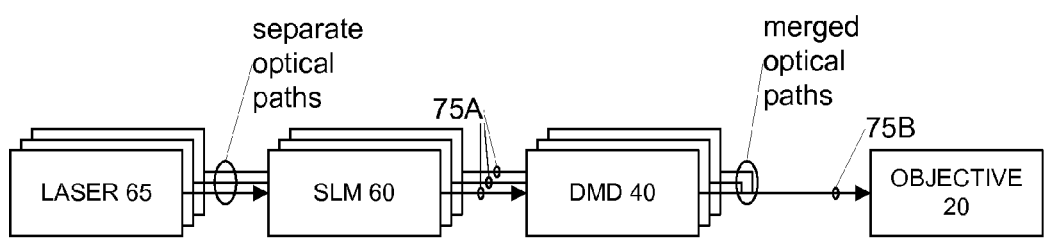
FIG. 1C illustrates a plural optical path example of the optical illumination system of FIG. 1A.

FIG. 1C illustrates a plural optical path example of the optical illumination system 100 of FIG. 1A. In the illustrated embodiment, the plural optical path comprises a plurality of lasers 65 that each originate an illumination optical signal, for example, each laser 65 may originate an optical signal of a different color. Each laser 65 directs its respective optical signal to one of a plurality of SLMs 60 along separate optical paths and each SLM 60 in turn directs its respective optical signal to one of a plurality of DMDs 40 via one or more lenses 75A. Each of the plurality of DMDs 40 in turn directs its respective optical signal to the objective 20 via a single lens 75B. As shown in the figure, each optical signal in the plural optical path is merged into a single optical path prior to the single lens 75B.

Figure 2A:
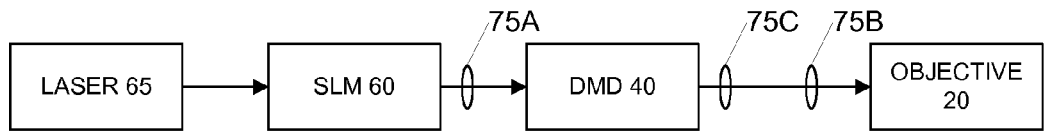
FIG. 2A is a simplified illustration of an alternative optical path in the optical illumination system of FIG. 1A.

FIG. 2A is a simplified illustration of an alternative optical path in the optical illumination system 100 of FIG. 1A. The alternative optical path is similar to the optical path previously described with respect to FIG. 1B and therefore only the differences will be described. As such, the laser 65 directs the optical signal to the SLM 60 and the SLM 60 in turn directs the optical signal to the DMD 40 via one or more lenses 75A. The DMD 40 in turn directs the optical signal to the objective 20 via one or more lenses 75C and 75B. In one embodiment, the lens 75C is an optical relay lens that allows additional elements to be incorporated into the optical illumination system 100 and also allows the optical illumination system 100 to be integrated with a microscope system (not shown) without significant modifications to the microscope system.

Figure 2B:
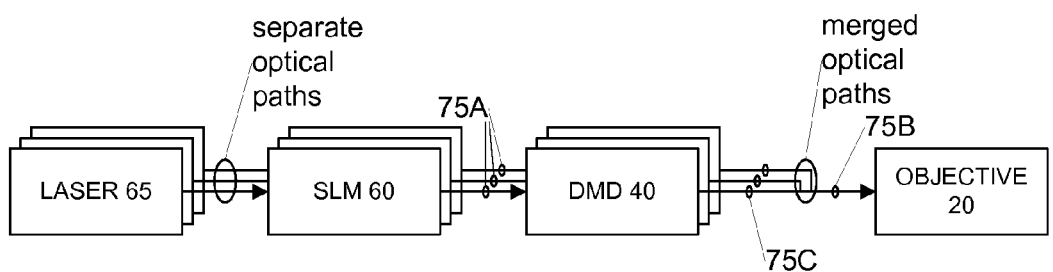
FIG. 2B illustrates an alternative plural optical path example of the optical illumination system of FIG. 1A.

FIG. 2B illustrates an alternative plural optical path example of the optical illumination system of FIG. 1A. The alternative plural optical path is similar to the plural optical path previously described with respect to FIG. 1C and therefore only the differences will be described. Each laser 65 directs its respective optical signal to one of a plurality of SLMs 60 along separate optical paths and each SLM 60 in turn directs its respective optical signal to one of a plurality of DMDs 40 via one or more lenses 75A. Each of the plurality of DMDs 40 in turn directs its respective optical signal toward the objective lens 20 along separate optical paths and through separate single lenses 75C, after which the separate optical paths are merged into a single optical path and continue to the objective lens 20 via a single lens 75B.

Figure 3A:
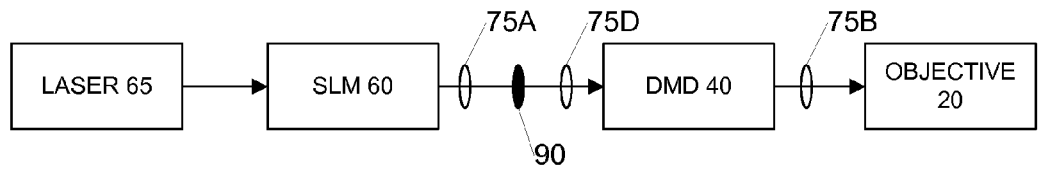
FIG. 3A is a simplified illustration of an alternative optical path in the optical illumination system of FIG. 1A.

FIG. 3A is a simplified illustration of an alternative optical path in the optical illumination system 100 of FIG. 1A. The alternative optical path is similar to the optical path previously described with respect to FIG. 1B and therefore only the differences will be described. As such, the laser 65 directs the optical signal to the SLM 60 and the SLM 60 in turn directs the optical signal to the DMD 40 via at least two lenses 75A and 75D. The DMD 40 in turn directs the optical signal to the objective 20 via one or lens 75B. In one embodiment, the phase filter 90 employs generalized phase contrast to pattern the optical signal onto the DMA 40.

Figure 3B:
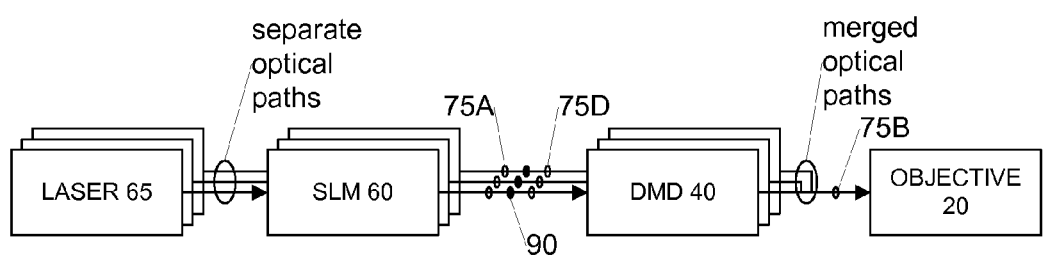
FIG. 3B illustrates an alternative plural optical path example of the optical illumination system of FIG. 1A.

FIG. 3B illustrates an alternative plural optical path example of the optical illumination system of FIG. 1A. The alternative plural optical path is similar to the plural optical path previously described with respect to FIG. 1C and therefore only the differences will be described. Each laser 65 directs its respective optical signal to one of a plurality of SLMs 60 along separate optical paths and each SLM 60 in turn directs its respective optical signal to one of a plurality of DMDs 40. Between the SLM 60 and the DMD 40, each optical signal on a separate optical path passes through the first lens 75A and then passes through a phase filter 90 and finally passes through the second lens 75D before arriving at the DMD 40. Each of the plurality of DMDs 40 in turn directs its respective optical signal toward the objective lens 20 and the separate optical paths are merged into a single optical path and continue to the objective lens 20 via a single lens 75B.

Figure 4:
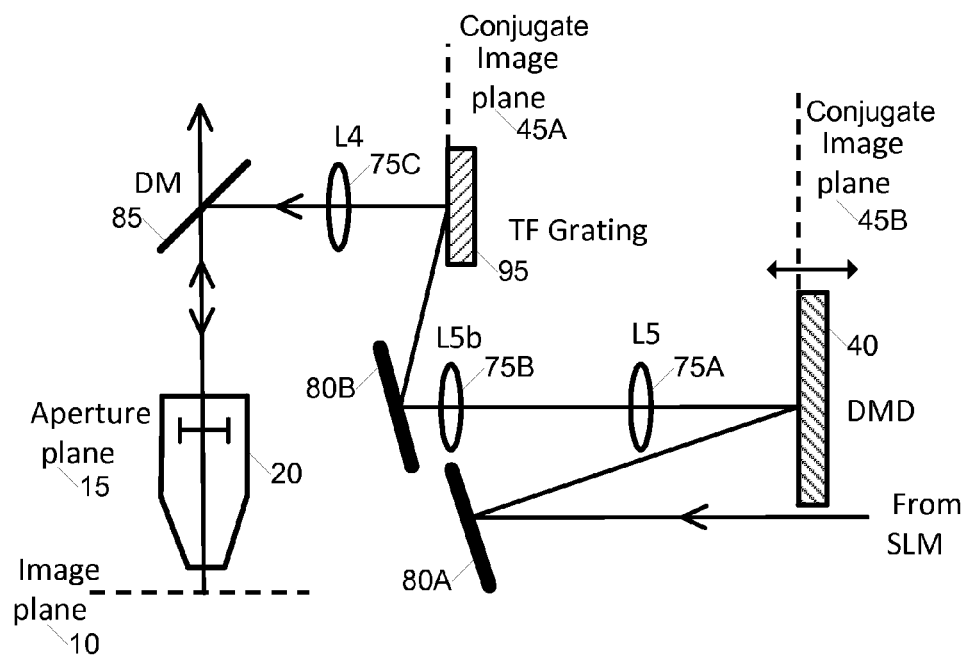
FIG. 4 illustrates a portion of an alternative example optical illumination system according to an embodiment.

FIG. 4 illustrates a portion of an alternative example optical illumination system 100 according to an embodiment. The alternative example optical illumination system 100 is similar to the optical illumination system 100 previously described with respect to FIG. 1A and therefore only the differences will be described. In the illustrated embodiment, the SLM 60 directs the optical signal to the DMD 40, which applies a desired mask pattern to the optical signal and then directs the patterned optical signal toward the image plane via one or more lenses 75A and 75B and the temporal focusing ("TF") grating 95. The TF grating 95 compresses the laser pulse to achieve temporal focusing and then directs the optical signal to the image plane via one or more lenses 75C and the objective lens 20.

Advantageously, the optical illumination system 100 can be used for both single and two-photon illumination. To achieve higher axial resolution with two-photon illumination, the TF grating 95 can be added as an additional stage in the optical path. Temporal focusing can be implemented by positioning the TF grating 95 in a conjugate plane 45A of the image plane 10. In the illustrated embodiment, lenses 75A and 75B together project the pattern from the DMD onto the diffraction grating. Lens 75C subsequently projects the pattern onto the image plane 10.

Figure 5:
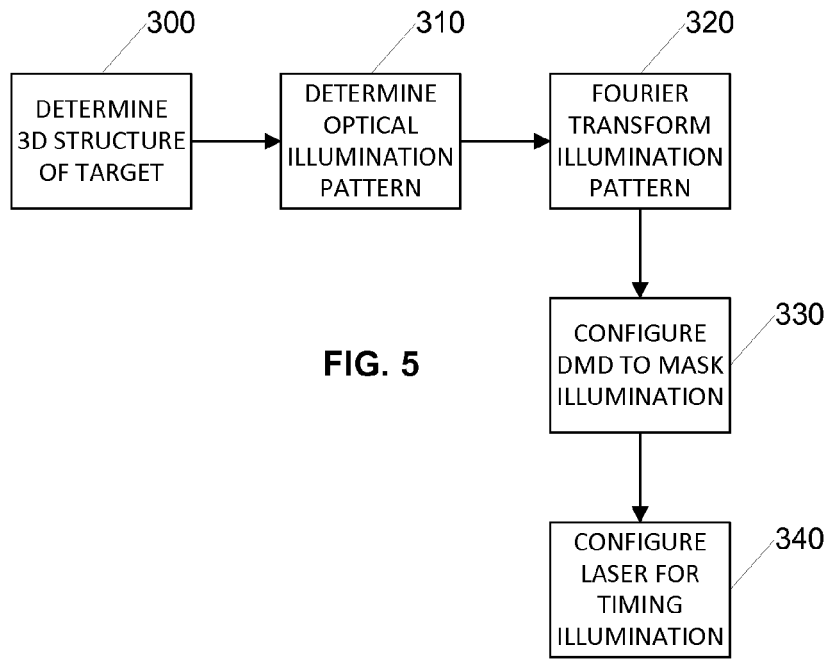
FIG. 5 is a flow diagram illustrating an example process for illuminating a sample in an optical illumination system according to an embodiment.

FIG. 5 is a flow diagram illustrating an example process for illuminating a sample in an optical illumination system according to an embodiment. The illustrated process can be carried out by an optical illumination system such as previously described with respect to FIGS. 1-4. Initially, in step 300 the system determines a three dimensional structure of the target to be illuminated. Next, in step 310 the system determines an optical illumination pattern to be applied. In step 320 the determined illumination pattern is fourier transformed and the DMD is configured in step 330 to apply the appropriate mask to the optical signal. Finally, in step 340 the coherence light source (e.g., laser) is configured to deliver the illumination pattern in accordance with the appropriate timing.

In an example embodiment of fluorescent microscopy, the fluorescent image is acquired by the digital camera. The computer receives input (e.g., from a user) and determines the locations on the sample in the image plane that need to be illuminated. The computer calculates the phase pattern and configures the SLM (e.g., via the previously described controller 50). The computer also determines the locations at the image plane that need to be masked in order to eliminate any undesired portion of the light pattern. The computer calculates the masking pattern and configures the DMD (e.g., via the previously described controller 35). The computer then controls the timing of the laser (directly or via a controller) to cause the image plane to be illuminated in the desired pattern.

In an example embodiment of three dimensional printing, the tandem SLM and DMD system is very useful for printing three dimensional structures that are otherwise difficult to fabricate by conventional approaches including sequential stacking of thin two dimensional layers. A drawback of the conventional sequential stacking of thin two dimensional layers approach is the poor structural stability of very thin lattice works that are built up as layers. An advantage of using the tandem SLM and DMD system over the conventional approaches is the superior stability of these same very thin lattice works if fabricated simultaneously in three dimensions using the tandem SLM and DMD system.

Furthermore, direct laser writing ("DLW"), often involving femtosecond lasers capable of generating a more precisely located multi-photon effect have been used in 3D lithographic polymerization. This results from laser induced photo-crosslinking of photo- or thermo-polymers within precisely localized spots of micrometer and sub micrometer scale. The approach has proven to be an efficient way to produce useful micro/nano-structures with diverse applications. For example, structures with micro-optics and photonics applications can be made of hard, optically diffracting material, with low shrinkage and distortion during lithography. An example includes but is not limited to the zirconium-silicon based hybrid sol-gel photopolymer.

Other structures useful in tissue engineering and regenerative medicine can be made using soft, water soluble photo-polymerizable mixtures that can generate three dimensional structures with hydrogel properties. For example 3D porous scaffolds have are desirable because they promote regeneration of tissue by allowing for greater cell-cell contact and better exchange of nutrients and wastes and more efficient blood vessel in growth. One application of such a scaffold could be the creation of artificial skin for treating burns and large skin sores.

The SLM and DMD tandem system enables efficient parallelization of the three dimensional printing process by allowing precise delivery of sufficient two photon energy for driving photo-crosslinking reactions in discrete spots arranged in three dimensions. The rapid and precisely controlled movement of those spots can be programmed to build three dimensional structures faster and with more complex features in a shorter period of time because of the multiplexing afforded by the tandem system. Use of the SLM and DMD tandem system also allows for masking of unwanted diffraction patterns as previously discussed.

In one embodiment, the SLM and DMD tandem system directs an optical signal to the image plane that comprises a three dimensional pattern of laser light intensity, where the pattern is shaped by the amplitude modulating spatial light modulator. Advantageously, the three dimensional pattern of laser light intensity can be designed to trigger photo-crosslinking of materials to lithographically produce a structure of a predetermined three dimensional pattern where the structure comprises the photo-crosslinked material. In one embodiment, the photo-crosslinked material is a rigid material, for example (but not limited to) a zincromium-silicon material such as Ormisil. The photo-crosslinked material can be selected based on desirable optical properties for specific uses such as in micro-optic or photonic devices used in industries such as (but not limited to) the telecommunication industry.

In an alternative embodiment, the photo-crosslinked material comprises a biocompatible and porous hydrogel and may, for example, produce an extracellular matrix that can be used to promote three dimensional assembly of tissue-like material such as (but not limited to) artificial skin.

Figure 6:
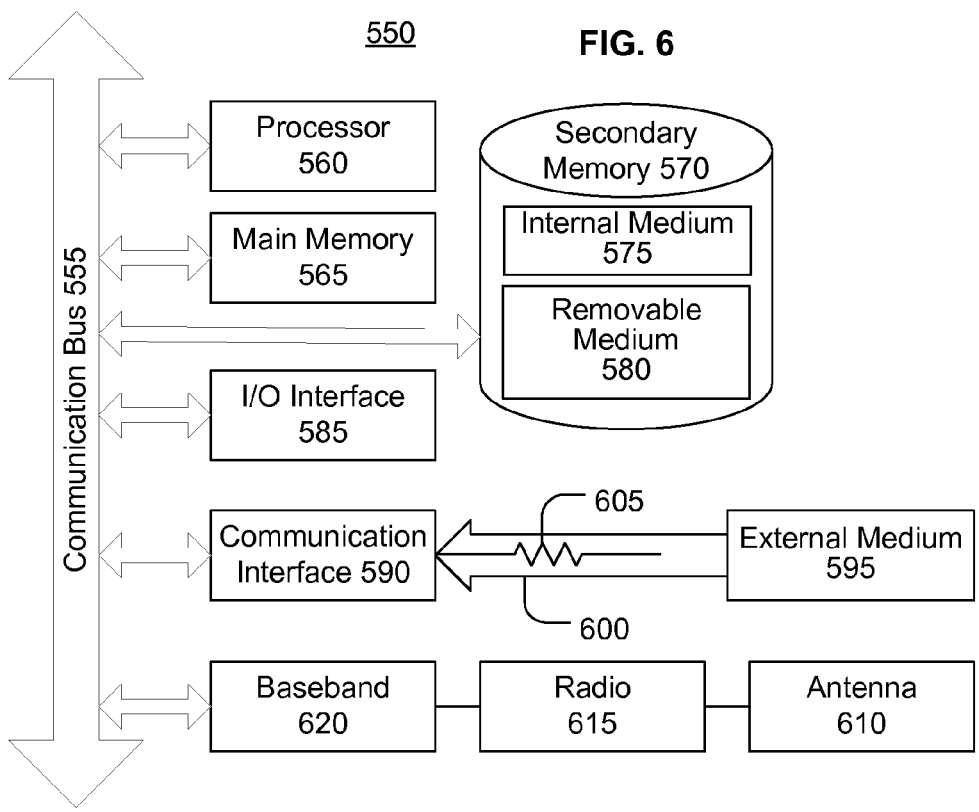
FIG. 6 is a block diagram illustrating an example wired or wireless processor enabled device that may be used in connection with various embodiments described herein.

FIG. 6 is a block diagram illustrating an example wired or wireless processor enabled device ("system 550") that may be used in connection with various embodiments described herein. For example the system 550 may be used as or in conjunction with an optical illumination system as previously described with respect to FIGS. 1-4. For example, the system 550 may operate at least in part as the digital camera, computer, controller or laser as previously described with respect to FIGS. 1-4. The system 550 can be a conventional personal computer, computer server, personal digital assistant, smart phone, tablet computer, or any other processor enabled device that is capable of wired or wireless data communication. Other computer systems and/or architectures may be also used, as will be clear to those skilled in the art.

The system 550 preferably includes one or more processors, such as processor 560. Additional processors may be provided, such as an auxiliary processor to manage input/output, an auxiliary processor to perform floating point mathematical operations, a special-purpose microprocessor having an architecture suitable for fast execution of signal processing algorithms (e.g., digital signal processor), a slave processor subordinate to the main processing system (e.g., back-end processor), an additional microprocessor or controller for dual or multiple processor systems, or a coprocessor. Such auxiliary processors may be discrete processors or may be integrated with the processor 560.

The processor 560 is preferably connected to a communication bus 555. The communication bus 555 may include a data channel for facilitating information transfer between storage and other peripheral components of the system 550. The communication bus 555 further may provide a set of signals used for communication with the processor 560, including a data bus, address bus, and control bus (not shown). The communication bus 555 may comprise any standard or non-standard bus architecture such as, for example, bus architectures compliant with industry standard architecture ("ISA"), extended industry standard architecture ("EISA"), Micro Channel Architecture ("MCA"), peripheral component interconnect ("PCI") local bus, or standards promulgated by the Institute of Electrical and Electronics Engineers ("IEEE") including IEEE 488 general-purpose interface bus ("GPIB"), IEEE 696/S-100, and the like.

System 550 preferably includes a main memory 565 and may also include a secondary memory 570. The main memory 565 provides storage of instructions and data for programs executing on the processor 560. The main memory 565 is typically semiconductor-based memory such as dynamic random access memory ("DRAM") and/or static random access memory ("SRAM"). Other semiconductor-based memory types include, for example, synchronous dynamic random access memory ("SDRAM"), Rambus dynamic random access memory ("RDRAM"), ferroelectric random access memory ("FRAM"), and the like, including read only memory ("ROM").

The secondary memory 570 may optionally include a internal memory 575 and/or a removable medium 580, for example a floppy disk drive, a magnetic tape drive, a compact disc ("CD") drive, a digital versatile disc ("DVD") drive, etc. The removable medium 580 is read from and/or written to in a well-known manner. Removable storage medium 580 may be, for example, a floppy disk, magnetic tape, CD, DVD, SD card, etc.

The removable storage medium 580 is a non-transitory computer readable medium having stored thereon computer executable code (i.e., software) and/or data. The computer software or data stored on the removable storage medium 580 is read into the system 550 for execution by the processor 560.

In alternative embodiments, secondary memory 570 may include other similar means for allowing computer programs or other data or instructions to be loaded into the system 550. Such means may include, for example, an external storage medium 595 and an interface 570. Examples of external storage medium 595 may include an external hard disk drive or an external optical drive, or and external magneto-optical drive.

Other examples of secondary memory 570 may include semiconductor-based memory such as programmable read-only memory ("PROM"), erasable programmable read-only memory ("EPROM"), electrically erasable read-only memory ("EEPROM"), or flash memory (block oriented memory similar to EEPROM). Also included are any other removable storage media 580 and communication interface 590, which allow software and data to be transferred from an external medium 595 to the system 550.

System 550 may also include an input/output ("I/O") interface 585. The I/O interface 585 facilitates input from and output to external devices. For example the I/O interface 585 may receive input from a keyboard or mouse and may provide output to a display. The I/O interface 585 is capable of facilitating input from and output to various alternative types of human interface and machine interface devices alike.

System 550 may also include a communication interface 590. The communication interface 590 allows software and data to be transferred between system 550 and external devices (e.g. printers), networks, or information sources. For example, computer software or executable code may be transferred to system 550 from a network server via communication interface 590. Examples of communication interface 590 include a modem, a network interface card ("NIC"), a wireless data card, a communications port, a PCMCIA slot and card, an infrared interface, and an IEEE 1394 fire-wire, just to name a few.

Communication interface 590 preferably implements industry promulgated protocol standards, such as Ethernet IEEE 802 standards, Fiber Channel, digital subscriber line ("DSL"), asynchronous digital subscriber line ("ADSL"), frame relay, asynchronous transfer mode ("ATM"), integrated digital services network ("ISDN"), personal communications services ("PCS"), transmission control protocol/Internet protocol ("TCP/IP"), serial line Internet protocol/point to point protocol ("SLIP/PPP"), and so on, but may also implement customized or non-standard interface protocols as well.

Software and data transferred via communication interface 590 are generally in the form of electrical communication signals 605. These signals 605 are preferably provided to communication interface 590 via a communication channel 600. In one embodiment, the communication channel 600 may be a wired or wireless network, or any variety of other communication links. Communication channel 600 carries signals 605 and can be implemented using a variety of wired or wireless communication means including wire or cable, fiber optics, conventional phone line, cellular phone link, wireless data communication link, radio frequency ("RF") link, or infrared link, just to name a few.

Computer executable code (i.e., computer programs or software) is stored in the main memory 565 and/or the secondary memory 570. Computer programs can also be received via communication interface 590 and stored in the main memory 565 and/or the secondary memory 570. Such computer programs, when executed, enable the system 550 to perform the various functions of the present invention as previously described.

In this description, the term "computer readable medium" is used to refer to any non-transitory computer readable storage media used to provide computer executable code (e.g., software and computer programs) to the system 550. Examples of these media include main memory 565, secondary memory 570 (including internal memory 575, removable medium 580, and external storage medium 595), and any peripheral device communicatively coupled with communication interface 590 (including a network information server or other network device). These non-transitory computer readable mediums are means for providing executable code, programming instructions, and software to the system 550.

In an embodiment that is implemented using software, the software may be stored on a computer readable medium and loaded into the system 550 by way of removable medium 580, I/O interface 585, or communication interface 590. In such an embodiment, the software is loaded into the system 550 in the form of electrical communication signals 605. The software, when executed by the processor 560, preferably causes the processor 560 to perform the inventive features and functions previously described herein.

The system 550 also includes optional wireless communication components that facilitate wireless communication over a voice and over a data network. The wireless communication components comprise an antenna system 610, a radio system 615 and a baseband system 620. In the system 550, radio frequency ("RF") signals are transmitted and received over the air by the antenna system 610 under the management of the radio system 615.

In one embodiment, the antenna system 610 may comprise one or more antennae and one or more multiplexors (not shown) that perform a switching function to provide the antenna system 610 with transmit and receive signal paths. In the receive path, received RF signals can be coupled from a multiplexor to a low noise amplifier (not shown) that amplifies the received RF signal and sends the amplified signal to the radio system 615.

In alternative embodiments, the radio system 615 may comprise one or more radios that are configured to communicate over various frequencies. In one embodiment, the radio system 615 may combine a demodulator (not shown) and modulator (not shown) in one integrated circuit ("IC"). The demodulator and modulator can also be separate components. In the incoming path, the demodulator strips away the RF carrier signal leaving a baseband receive audio signal, which is sent from the radio system 615 to the baseband system 620.

If the received signal contains audio information, then baseband system 620 decodes the signal and converts it to an analog signal. Then the signal is amplified and sent to a speaker. The baseband system 620 also receives analog audio signals from a microphone. These analog audio signals are converted to digital signals and encoded by the baseband system 620. The baseband system 620 also codes the digital signals for transmission and generates a baseband transmit audio signal that is routed to the modulator portion of the radio system 615. The modulator mixes the baseband transmit audio signal with an RF carrier signal generating an RF transmit signal that is routed to the antenna system and may pass through a power amplifier (not shown). The power amplifier amplifies the RF transmit signal and routes it to the antenna system 610 where the signal is switched to the antenna port for transmission.

The baseband system 620 is also communicatively coupled with the processor 560. The central processing unit 560 has access to data storage areas 565 and 570. The central processing unit 560 is preferably configured to execute instructions (i.e., computer programs or software) that can be stored in the memory 565 or the secondary memory 570. Computer programs can also be received from the baseband processor 610 and stored in the data storage area 565 or in secondary memory 570, or executed upon receipt. Such computer programs, when executed, enable the system 550 to perform the various functions of the present invention as previously described. For example, data storage areas 565 may include various software modules (not shown) that are executable by processor 560.

Various embodiments may also be implemented primarily in hardware using, for example, components such as application specific integrated circuits ("ASICs"), or field programmable gate arrays ("FPGAs"). Implementation of a hardware state machine capable of performing the functions described herein will also be apparent to those skilled in the relevant art. Various embodiments may also be implemented using a combination of both hardware and software.

Furthermore, those of skill in the art will appreciate that the various illustrative logical blocks, modules, circuits, and method steps described in connection with the above described figures and the embodiments disclosed herein can often be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the invention. In addition, the grouping of functions within a module, block, circuit or step is for ease of description. Specific functions or steps can be moved from one module, block or circuit to another without departing from the invention.

Moreover, the various illustrative logical blocks, modules, and methods described in connection with the embodiments disclosed herein can be implemented or performed with a general purpose processor, a digital signal processor ("DSP"), an ASIC, FPGA or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

Additionally, the steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium including a network storage medium. An exemplary storage medium can be coupled to the processor such the processor can read information from, and write information to, the storage medium. In the alternative, the storage medium can be integral to the processor. The processor and the storage medium can also reside in an ASIC.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly not limited.

What is claimed is:

1. A two photon excitation optical illumination system having an optical axis comprising:
    an image plane perpendicular to an optical axis;
    an amplitude modulating spatial light modulator positioned substantially adjacent to a conjugate plane of the image plane and configured to direct an optical signal to the image plane;
    an aperture plane perpendicular to the optical axis;
    a phase modulating spatial light modulator positioned in a conjugate plane of the aperture plane and configured to direct an optical signal to the amplitude modulating spatial light modulator;
    a coherence light source optically coupled with the phase modulating spatial light modulator, wherein said coherence light source is configured to illuminate at least a portion of the image plane by directing an optical signal to the phase modulating spatial light modulator, which directs said optical signal to the amplitude modulating spatial light modulator, which directs said optical signal to the image plane.

2. The system of claim 1, wherein the coherence light source comprises a continuous wave laser.

3. The system of claim 1, wherein the coherence light source comprises a pulsed laser.

4. The system of claim 1, wherein the coherence light source comprises an amplified laser.

5. The system of claim 1, further comprising a beam expander positioned in an optical path between the coherence light source and the phase modulating spatial light modulator, said beam expander configured to direct the optical signal to fill at least a portion of a surface of the phase modulating spatial light modulator.

6. The system of claim 5, wherein said beam expander is further configured to direct the optical signal to fill substantially all of the surface of the phase modulating spatial light modulator.

7. The system of claim 1, wherein the amplitude modulating spatial light modulator comprises a digital micromirror device.

8. The system of claim 1, wherein the phase modulating spatial light modulator comprises a phase only spatial light modulator.

9. The system of claim 1, wherein the angle of incidence of the optical signal to the amplitude modulating spatial light modulator is substantially 12 degrees.

10. The system of claim 1, wherein the angle of incidence of the optical signal to the phase modulating spatial light modulator is less than or equal to 10 degrees.

11. The system of claim 1, further comprising a first lens positioned in an optical path between the amplitude modulating spatial light modulator and an objective lens having a back aperture, wherein the first lens is configured to substantially fill the back aperture of the objective lens with the optical signal.

12. The system of claim 11, wherein the first lens is positioned in the optical path equidistant between the conjugate image plane substantially adjacent to the amplitude modulating spatial light modulator and the back aperture of the objective lens.

13. The system of claim 12, wherein a first distance between the first lens and the conjugate image plane substantially adjacent to the amplitude modulating spatial light modulator and a second distance between the first lens and the back aperture of the objective lens are each equal to the focal length of the first lens.

14. The system of claim 1, further comprising a second lens positioned in an optical path between the phase modulating spatial light modulator and the conjugate image plane substantially adjacent to the amplitude modulating spatial light modulator, wherein the second lens is configured to position the phase modulating spatial light modulator in a conjugate image plane of the aperture plane.

15. The system of claim 14, wherein the second lens is positioned in the optical path equidistant between the phase modulating spatial light modulator and the conjugate image plane substantially adjacent to the amplitude modulating spatial light modulator.

16. The system of claim 15, wherein a first distance between the second lens and the phase modulating spatial light modulator and a second distance between the second lens and the conjugate image plane substantially adjacent to the amplitude modulating spatial light modulator are each equal to the focal length of the second lens.

17. The system of claim 1, further comprising an optical relay positioned in an optical path between the amplitude modulating spatial light modulator and an objective lens.

18. The system of claim 1, further comprising a first lens and a second positioned in an optical path between the phase modulating spatial light modulator and the amplitude modulating spatial light modulator and further comprising a phase filter positioned in the optical path between said first lens and said second lens.

19. The system of claim 1, further comprising a temporal focusing grating positioned in a conjugate plane of the image plane and configured to compress the optical signal from the amplitude modulating spatial light modulator for temporal focusing and direct the temporally focused optical signal to the image plane.

20. The system of claim 1, further comprising:
a plurality of amplitude modulating spatial light modulators each positioned in a conjugate plane of the image plane and configured to direct an optical signal to the image plane;
a plurality of phase modulating spatial light modulators each positioned in a conjugate plane of the aperture plane and configured to direct an optical signal to a respective one of the amplitude modulating spatial light modulators;
a plurality of coherence light sources each optically coupled with a respective one of the phase modulating spatial light modulators, wherein said coherence light sources are each configured to illuminate at least a portion of the image plane by directing an optical signal to a respective one of the phase modulating spatial light modulators, each of which in turn directs said optical signal to a respective one of the amplitude modulating spatial light modulators, each of which in turn directs said optical signal to a merged optical path for delivery to the image plane.

21. The system of claim 1, wherein the optical signal directed to the image plane by the amplitude modulating spatial light modulator comprises a three dimensional pattern of laser light intensity.

22. The system of claim 21, wherein said three dimensional pattern of laser light intensity is configured to trigger photo-crosslinking of materials to lithographically produce a structure of a predetermined three dimensional pattern.

23. The system of claim 22, wherein the photo-crosslinked material comprises a zincromium-silicon material.

24. The system of claim 22, wherein the photo-crosslinked material comprises a porous hydrogel.

25. The system of claim 24, wherein the porous hydrogel comprises an extracellular matrix.

* * * * *